(12) United States Patent
Chang et al.

(10) Patent No.: US 8,330,251 B2
(45) Date of Patent: Dec. 11, 2012

(54) SEMICONDUCTOR DEVICE STRUCTURE FOR REDUCING MISMATCH EFFECTS

(75) Inventors: Chung-Long Chang, Dou-Liu (TW); Chia-Yi Chen, Kao-Hsiung County (TW); Chih-Ping Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 219 days.

(21) Appl. No.: 11/474,762

(22) Filed: Jun. 26, 2006

(65) Prior Publication Data

US 2007/0296013 A1 Dec. 27, 2007

(51) Int. Cl.
*H01L 21/02* (2006.01)

(52) U.S. Cl. ............... 257/532; 257/307; 257/E27.048; 438/393

(58) Field of Classification Search ............. 257/307, 257/308, 532–535, E27.048, E29.342; 438/393
See application file for complete search history.

(56) References Cited

U.S. PATENT DOCUMENTS

| | | | |
|---|---|---|---|
| 4,954,927 A * | 9/1990 | Park | 361/328 |
| 5,304,506 A | 4/1994 | Porter et al. | |
| 5,583,359 A | 12/1996 | Ng et al. | |
| 5,939,766 A | 8/1999 | Stolmeijer et al. | |
| 6,103,621 A | 8/2000 | Huang | |
| 6,104,053 A | 8/2000 | Nagai | |
| 6,306,721 B1 | 10/2001 | Teo et al. | |
| 6,383,858 B1 * | 5/2002 | Gupta et al. | 438/238 |
| 6,653,681 B2 | 11/2003 | Appel | |
| 6,730,581 B2 | 5/2004 | Suguro | |
| 6,743,671 B2 | 6/2004 | Hu et al. | |
| 6,819,542 B2 | 11/2004 | Tsai et al. | |
| 6,980,414 B1 * | 12/2005 | Sutardja | 361/306.3 |
| 7,126,809 B2 | 10/2006 | Iioka et al. | |
| 7,209,340 B2 | 4/2007 | Iioka et al. | |
| 7,276,776 B2 | 10/2007 | Okuda et al. | |
| 7,485,914 B2 * | 2/2009 | Huang et al. | 257/309 |
| 7,554,117 B2 | 6/2009 | Nakamura | |
| 2002/0094643 A1 | 7/2002 | Solomon et al. | |
| 2002/0195669 A1 | 12/2002 | Morihara et al. | |
| 2003/0036244 A1 * | 2/2003 | Jones et al. | 438/397 |
| 2003/0183864 A1 * | 10/2003 | Miyazawa | 257/307 |
| 2004/0140487 A1 | 7/2004 | Furumiya et al. | |
| 2006/0006496 A1 * | 1/2006 | Harris et al. | 257/532 |
| 2009/0090951 A1 | 4/2009 | Chang et al. | |
| 2009/0325376 A1 | 12/2009 | Nakamura | |

FOREIGN PATENT DOCUMENTS

| | | |
|---|---|---|
| CN | 1765009 A | 4/2006 |
| CN | 1835235 A | 9/2006 |

* cited by examiner

*Primary Examiner* — Robert Huber
(74) *Attorney, Agent, or Firm* — Slater & Matsil, L.L.P.

(57) ABSTRACT

An integrated circuit chip includes a first electronic device, a second electronic device, and a common electrode feature. The first electronic device includes a first feature. The first electronic device has a first footprint area in a given layer. The second electronic device includes a second feature. The second electronic device has a second footprint area in the given layer. The first and second electronic devices are electrically matched. The common electrode feature is common to the first and second electronic devices. The common electrode is at least partially located in the given layer. More than a majority of the first footprint area overlaps with the second footprint area. A first spacing between the first feature and the common electrode feature is about the same as a second spacing between the second feature and the common electrode feature.

18 Claims, 19 Drawing Sheets

SEMICONDUCTOR DEVICE STRUCTURE FOR REDUCING MISMATCH EFFECTS

TECHNICAL FIELD

The present invention generally relates to manufacturing integrated circuit chips and semiconductor devices. In one aspect, the present invention relates more particularly to layouts of capacitor structures of integrated circuits for reducing mismatch effects and/or reducing chip real estate required.

BACKGROUND

Capacitors are used in integrated circuit designs to achieve different functions such as dynamic random access memories, bypassing, resonant circuits, filters, and mix-signal applications, for example. A conventional capacitor in an integrated circuit has two flat conductive plates, with one on the top of the other, and an intervening layer of dielectric material. Such capacitors having a sandwich structure are often referred to as metal-insulator-metal (MIM) capacitors. One disadvantage of this structure is the relatively large area of the chip that is required to obtain a desired capacitance.

One approach to reducing the required chip area involves stacking several layers of conductive plates, which are alternately connected to form opposite electrodes of the capacitor. Another approach to reducing the required chip area involves the use of a layer of parallel interdigitated strips as electrodes having a dielectric material therebetween. Such a structure provides a higher capacitance value per unit area, as a result of the increased electrode (plate) area afforded by the opposing top, bottom, and sidewall surfaces. Such capacitors having an interdigitated structure are often referred to as metal-oxide-metal (MOM) capacitors. For purposes of discussion herein, "MOM capacitors" is used generally to refer to capacitors having an interdigitated capacitor structure, regardless of layout and regardless of material choices for the electrodes and the dielectric material(s) therebetween.

FIG. 1 illustrates a prior art MOM capacitor 20 having parallel strips 22, 24, 26, 28 in the first layer 30, which are alternately connected to the first bus 32 and second bus 34. Strips 22 and 26 are connected to the first bus 32 with the same polarity. Strips 24 and 28 are connected to the second bus 34 with the opposite polarity to the first bus 32. At least one more layer of the same structure overlies the first layer 30. FIG. 2A shows the MOM capacitor structure 20 in cross section through the strips, along line 2-2 in FIG. 1. The first buses (e.g., 32) of different layers and the second buses (e.g., 34) of different layers are respectively connected by vias (not shown). Dielectric material (not shown) is filled between strips of the same and different layers.

Because the interdigitated fingers of each layer are parallel to each other in this structure 20 of FIG. 2A, any misalignment of strips from one layer to the next, caused, for example, by overall registration errors, will change relative positions between the electrodes. As a result, the overall capacitance of the structure will deviate from the expected value and affect the performance of the integrated circuit. FIG. 2B is a variation on FIG. 2A, which includes conductive vias 27 connecting between the fingers (FVMOM, Finger-Via MOM device). Thus, one disadvantage of prior art interdigitated capacitors is the undesired variance of capacitance caused by misalignment of strips between adjacent layers because capacitance varies when the relative position between parallel strips of two adjacent layers changes.

FIG. 3 shows another alternative MOM capacitor structure 36 in cross-section through the strips, along line 3-3 in FIG. 1.

In comparing FIG. 3 to FIG. 2A, FIG. 3 provides another alternative for the placement of electrodes in one layer relative another layer. Each capacitor shown in FIGS. 1-3 may be laid out in an individual terminal routing as shown schematically in FIG. 4 (second matched capacitor not shown in FIGS. 1-3). FIG. 5 is a schematic showing another way that capacitors are sometimes connected, which is referred to a common terminal routing. In a typical common terminal routing configuration, two capacitors C1 and C2 share a common ground electrode 40.

MOM capacitors typically have many advantages over MIM capacitors and generally provide better performance across the board. For example, in comparison to a typical MIM capacitor, a MOM capacitor structure usually will have better capacitance per unit, better compatibility with the use of low-k dielectric materials and processes associated with the formation of low-k dielectric structures, ability to have a higher breakdown voltage, better temperature coefficient of change, ability for use in higher voltage applications (better VCC), and same or better Q-factor. However, mismatch of electrical characteristics is often more problematic in conventional MOM capacitors than in MIM capacitors, e.g., where a pair of capacitors are desired to be identical (electrically). It is preferable to minimize mismatch in MOM capacitors. For example, in an array of MOM capacitors for an analog-to-digital converter, it will be desirable to have the capacitors as closely matched as possible. Mismatch problems usually stem from layout design and process sensitivities. Process sensitivities may be caused by variations across a wafer. For example, uneven etching across a wafer or an uneven flow of gases at one point on a wafer compared to another may cause variations from one location to another on a same wafer or on a same chip. Feature density differences may also cause variations in etch rate, thereby creating a process sensitivity. In a damascene process, for example, more critical process sensitivity source comes from Cu CMP (e.g., Cu Pattern density, slurry uniformity, and deformation from polish pad).

FIG. 6 shows a pair of MOM capacitors C1 and C2 of the prior art having a common terminal routing configuration. The positive electrode 42 of capacitor C1 in FIG. 6 has a set of positive fingers 44 that are interdigitated with fingers 46 of the common ground electrode 40. Similarly, the positive electrode 48 of capacitor C2 in FIG. 6 has a set of positive fingers 50 that are interdigitated with fingers 46 of the common ground electrode 40, but at a different location. One of disadvantages of this configuration is that capacitors C1 and C2 in FIG. 6, each consumes its own footprint area, in spite of the shared common ground electrode 40. If capacitors C1 and C2 are intended to be matched to etch other, i.e., providing essentially identical capacitance characteristics, then another disadvantage of the configuration of FIG. 6 is the mismatch effects that may be caused by capacitor C1 being located at a location different than that of capacitor C2.

FIG. 7 shows a pair of cross-coupled capacitors C1 and C2 of the prior art having another common terminal routing configuration. In FIG. 7, part of capacitors C1 and C2 are on the right side and parts of capacitors C1 and C2 are on the left side of the structure 52. Also, part of capacitors C1 and C2 are on the upper side and parts of capacitors C1 and C2 are on the lower side of the structure 52. Thus, processing variations on the right side of the structure 52 are more likely to be experienced by both capacitors C1 and C2. Likewise, processing variations on the bottom side of the structure 52 are more likely to be experienced by both capacitors C1 and C2. This allows capacitors C1 and C2 to be more closely matched relative to each other, or at least less sensitive to process variations. The cross-coupling provided by the structure 52 of FIG. 7 has been shown to dramatically reduce mismatch effects, as compared to the structure 51 of FIG. 6. A disadvantage of the prior art structure 52 of FIG. 7 is the amount of footprint area required for the structure.

There is a constant drive in the semiconductor industry to reduce the amount of chip real estate used by devices for many reasons (e.g., providing higher operating speeds, providing more devices per wafer for greater processing yields). Hence, there is a need for MOM capacitor structures that reduce mismatch effects while also reducing the amount of chip real estate required to provide the devices.

SUMMARY OF THE INVENTION

The problems and needs outlined above may be addressed by embodiments of the present invention. In accordance with one aspect of the present invention, an integrated circuit chip is provided, which includes a first electronic device, a second electronic device, and a common electrode feature. The first electronic device includes a first feature. The first electronic device has a first footprint area in a given layer. The second electronic device includes a second feature. The second electronic device has a second footprint area in the given layer. The first and second electronic devices are electrically matched. The common electrode feature is common to the first and second electronic devices. The common electrode is at least partially located in the given layer. More than a majority of the first footprint area overlaps with the second footprint area. A first spacing between the first feature and the common electrode feature is about the same as a second spacing between the second feature and the common electrode feature. The first spacing is less than about three times a width of the common electrode feature.

In accordance with another aspect of the present invention, an integrated circuit chip is provided, which includes a first electronic device, a second electronic device, and a common electrode feature. The first electronic device includes a first feature in a given layer. The second electronic device includes a second feature in the given layer. The first and second electronic devices are electrically matched. The common electrode feature is common to the first and second electronic devices. The common electrode is at least partially located in the given layer. A first spacing is between the first feature and the common electrode feature. A second spacing is between the second feature and the common electrode feature. Each of the first and second spacings is less than about three times a width of the common electrode feature.

In accordance with yet another aspect of the present invention, an integrated circuit chip is provided, which includes a first interdigitated capacitor device, a second interdigitated capacitor device, and a common electrode. The first interdigitated capacitor device includes a first set of electrode fingers in a given layer. The second interdigitated capacitor device includes a second set of electrode fingers in the given layer. The common electrode is shared by the first and second capacitors. The common electrode includes a set of common electrode fingers in the given layer. At least one of the first set of electrodes is adjacent to a certain one of the common electrode fingers and separated by a first distance. At least one of the second set of electrodes is adjacent to the certain one of the common electrode fingers and separated by a second distance. The first distance is less than about 20% greater than the second distance. The second distance is less than about 20% greater than the first distance.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
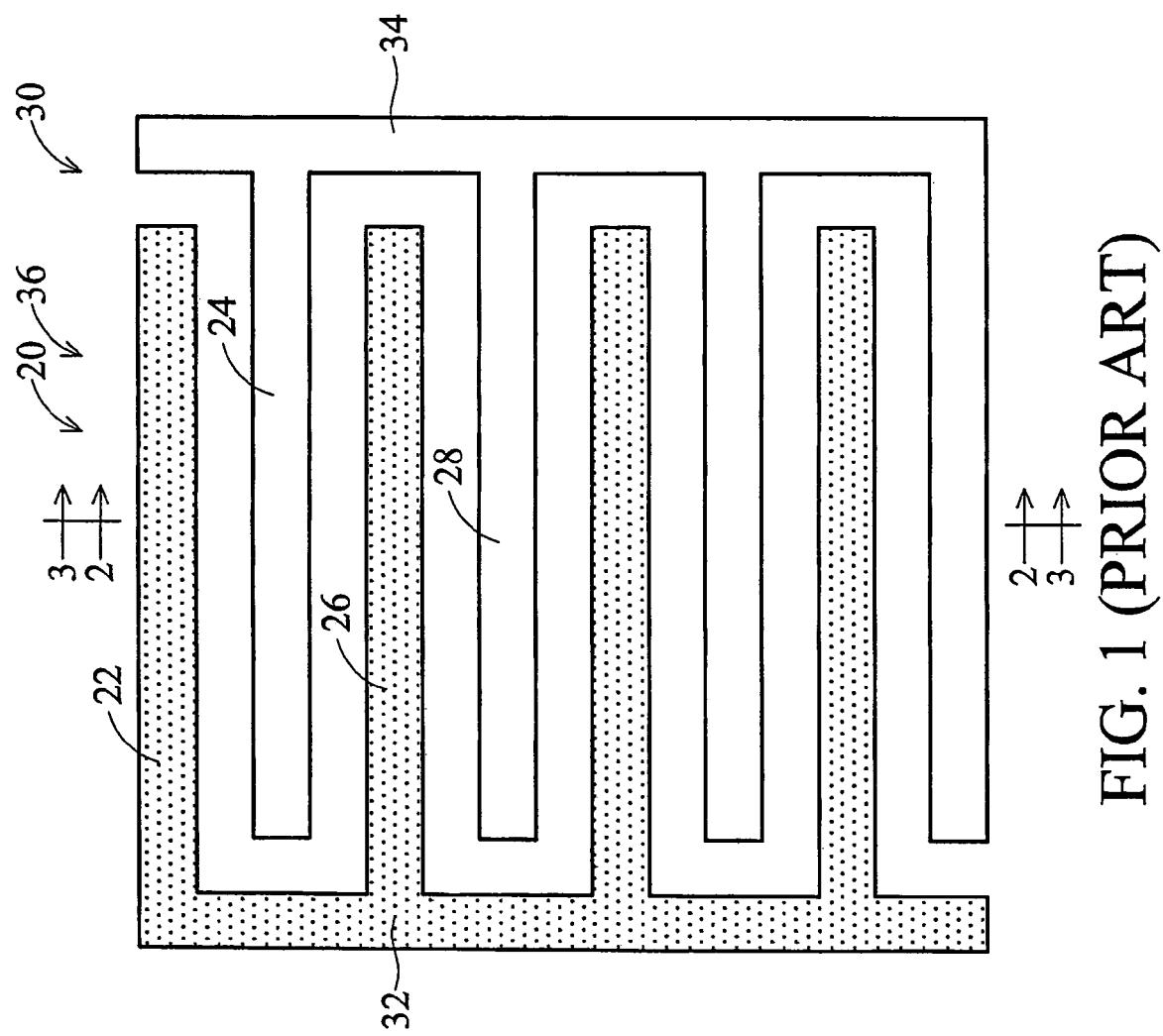
FIG. 1 is a top plan view for an interdigitated MOM capacitor of the prior art.
Figure 2A:
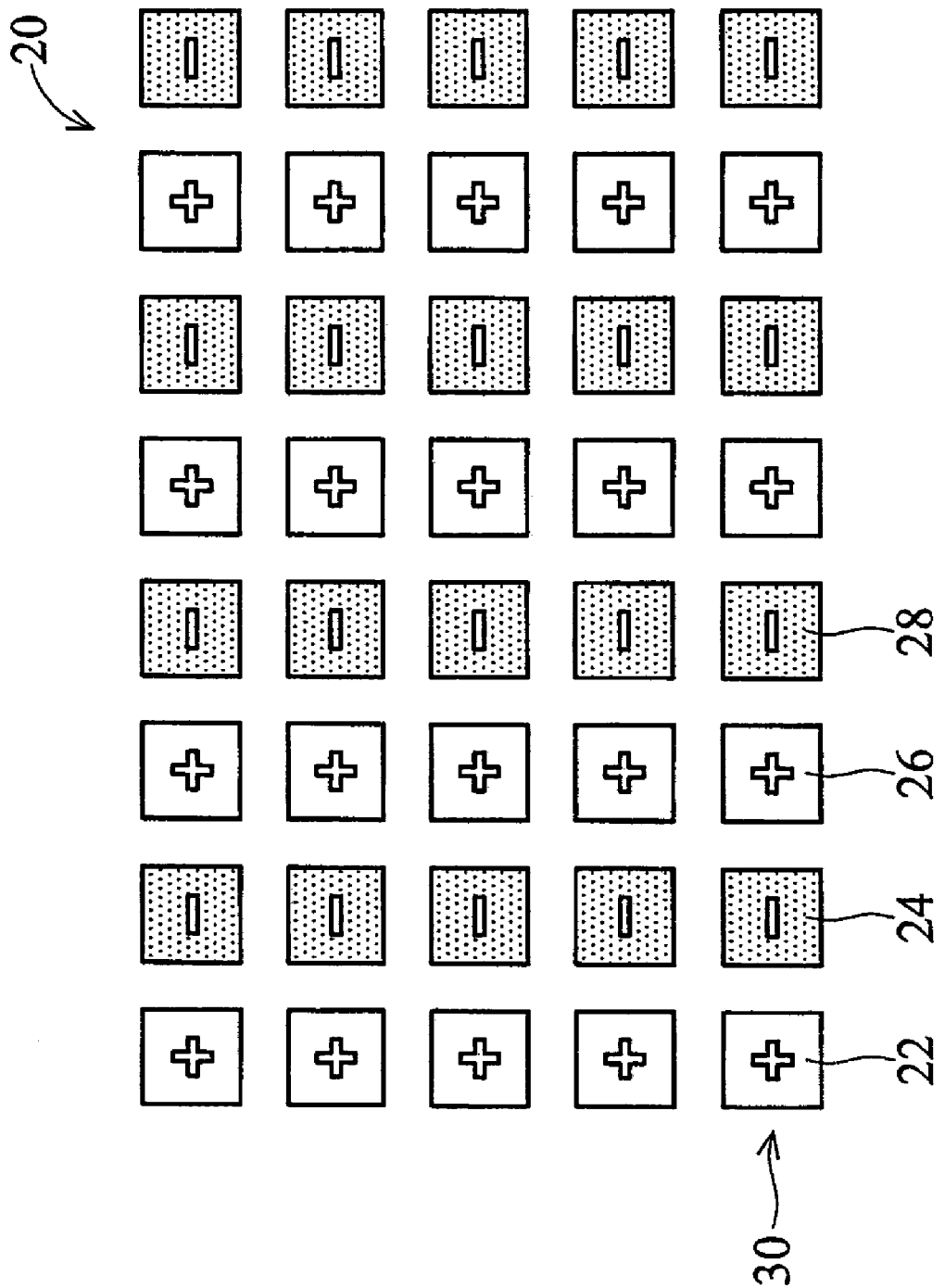
FIG. 2A is a cross-section view of a prior art MOM capacitor, as taken along line 2-2 in FIG. 1.
Figure 2B:
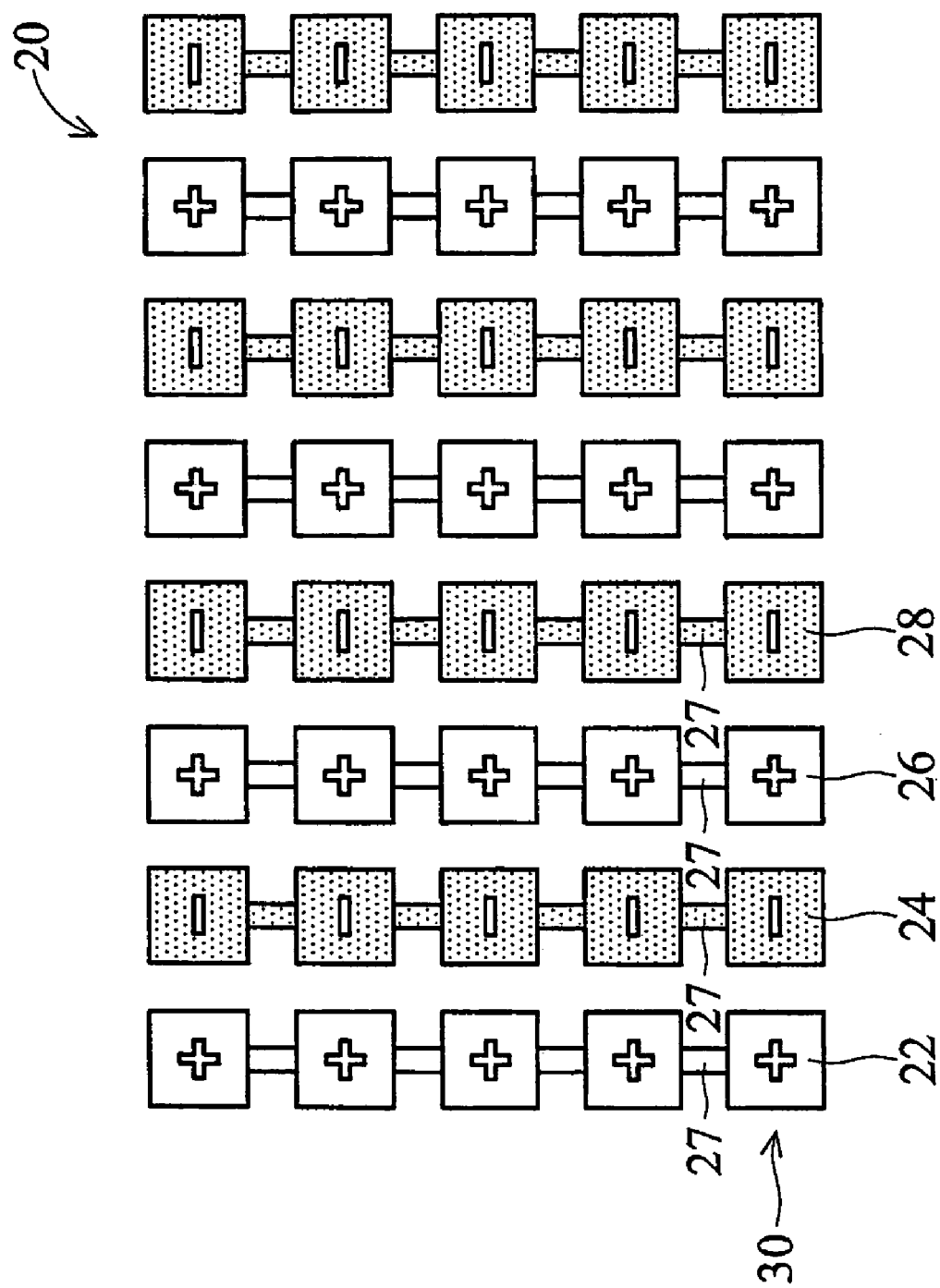
FIG. 2B is a cross-section view of another prior art MOM capacitor, as taken along line 2-2 in FIG. 1.
Figure 3:
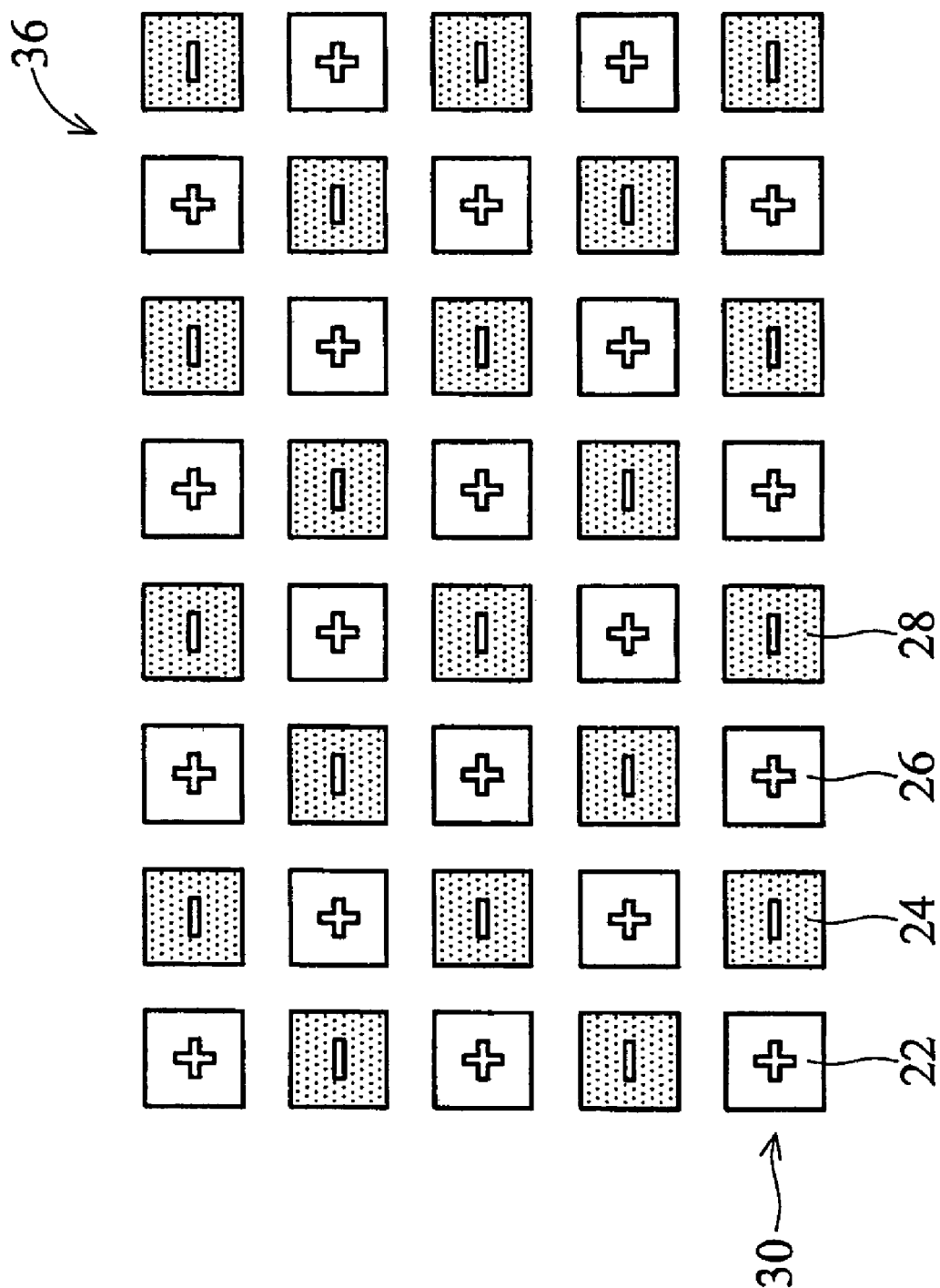
FIG. 3 is a cross-section view of a prior art MOM capacitor, as taken along line 3-3 in FIG. 1.
Figure 4:
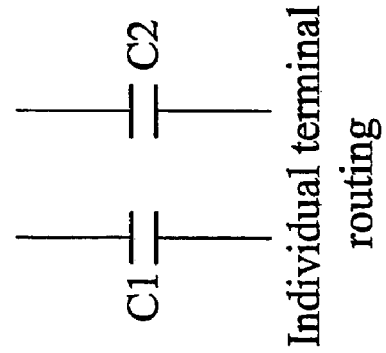
FIG. 4 is a schematic of two capacitors having an individual terminal routing configuration.
Figure 5:
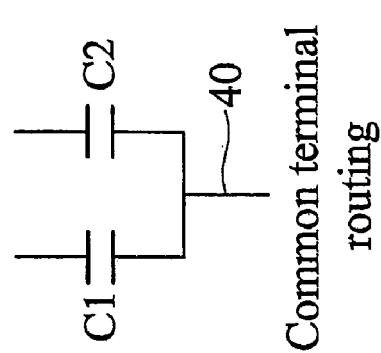
FIG. 5 is a schematic of two capacitors having a common terminal routing configuration.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a device structure that reduces mismatch effects while also reducing the chip real estate required for the devices, as compared to prior art structures.

Figure 8:
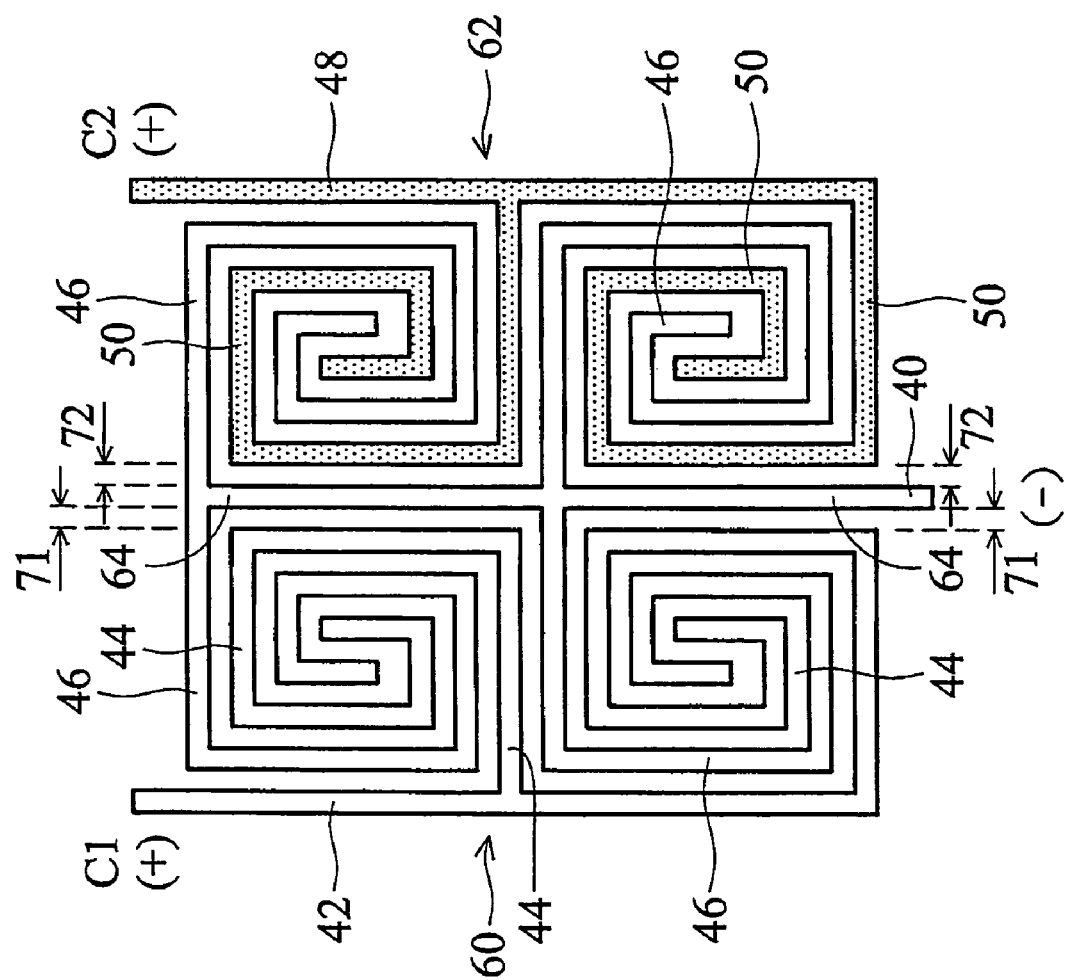
FIG. 8 shows a first illustrative embodiment of the present invention.

FIG. 8 shows a first illustrative embodiment of the present invention. FIG. 8 shows a top plan view for part of a matched capacitor pair structure 60 for a given layer 62. The overall capacitor structure may extend into other layers (e.g., interconnected by conductive vias). The capacitor structure 60 of FIG. 8 may be repeated in other layers above and/or below the given layer shown in FIG. 8. In such layers, the structure 60 may have the same orientation as the given layer 62 shown in FIG. 8, the structure 60 may be flipped vertically, flipped horizontally, rotated 90 degrees, or rotated 180 degrees in a plan view, or combinations thereof, for example. The capacitor structure 60 of the first embodiment has a common terminal routing configuration, for example, because the two match capacitors C1 and C2 share a common electrode 40 (e.g., a common ground electrode).

Figure 6:
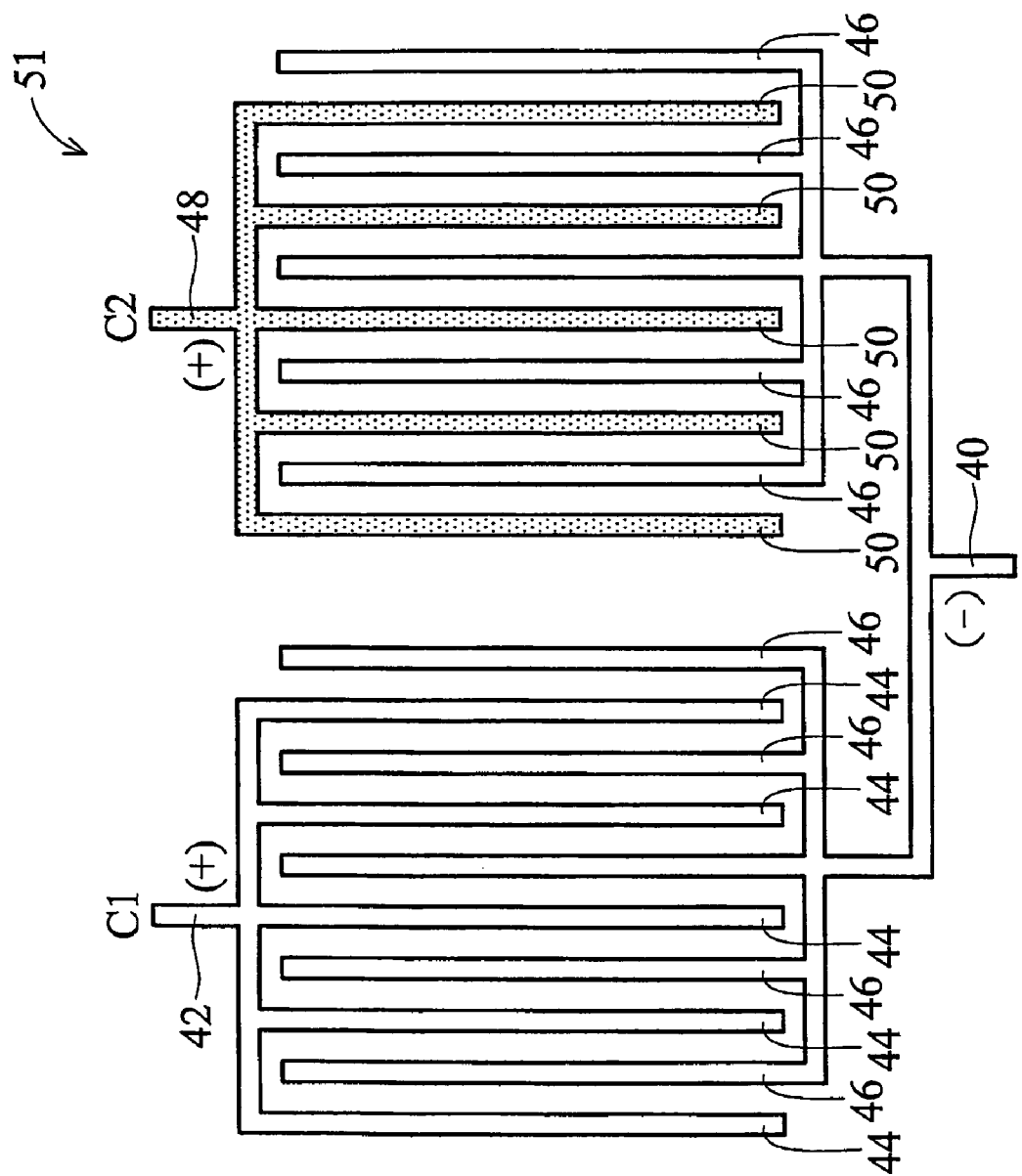
FIG. 6 is a top plan view for an interdigitated MOM capacitor of the prior art having a common terminal routing configuration.
Figure 7:
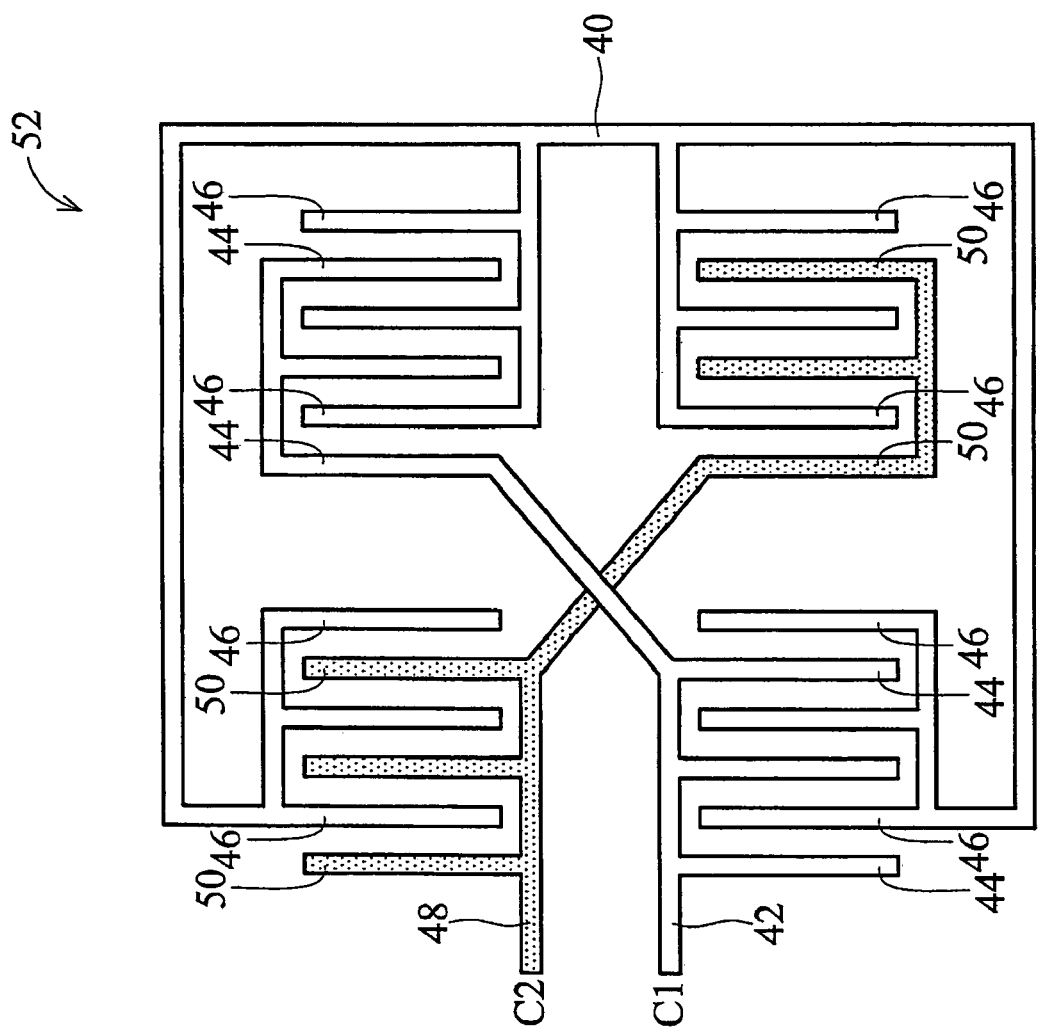
FIG. 7 is a top plan view for an interdigitated MOM capacitor of the prior art having a common terminal routing configuration and having a cross-coupling structure.

Still referring to FIG. 8 for the first embodiment, a first interdigitated MOM capacitor C1 has a first set of electrode fingers 44 in the given layer 62. A second interdigitated MOM capacitor C2 has a second set of electrode fingers 50 in the given layer 62. And, the common electrode 40 has a set of common electrode fingers 46. In the first embodiment, each of the first set of electrode fingers 44 for capacitor C1 is adjacent to at least one of the common electrode fingers 46, and each of the second set of electrode fingers 48 for capacitor C2 is adjacent to at least one of the common electrode fingers 46. A certain one 64 of the common electrode fingers 46 is adjacent to at least one of the first set of electrode fingers 42 (both in the given layer 62 for this example) in FIG. 8. A first distance 71 is between the certain one 64 of the common electrode fingers 46 and the adjacent finger of the first set of electrode fingers 44. Also in FIG. 8, the certain one 64 of the common electrode fingers 46 is adjacent to at least one of the second set of electrode fingers 50 (again both in the given layer 62 for this example). A second distance 72 is between the certain one 64 of the common electrode fingers 46 and the adjacent finger of the second set of electrode fingers 50. In a preferred embodiment, the first distance 71 is less than being about 20% greater than the second distance 72, and the second distance 72 is less than being about 20% greater than the first distance 71. In other words, the first distance 71 is not more than about 20% lesser or greater than the second distance 72. In a more preferred embodiment, the first distance 71 is equal to or approximately equal to the second distance 72. Thus, the capacitor structure 60 of the first embodiment has a pattern of first capacitor electrode—common electrode—second capacitor electrode, with approximately equal spacing between them. An advantage of this structure and spacing is that less chip real estate is required for the two capacitors, as compared to a structure of the prior art (see e.g., FIGS. 6 and 7).

In a preferred embodiment, the first and second distances 71, 72, each is less than about three times the width of a common electrode finger 46, a first capacitor electrode finger 44, a second capacitor electrode finger 50, or any combination thereof. By keeping the first and second distances 71, 72 smaller, the structure 60 can be made more densely, which may be advantageous for minimizing or optimizing chip real estate. Also, this provides greater overlap for the footprint areas of the devices C1 and C2, which also may help to reduce mismatch effects.

Figure 9:
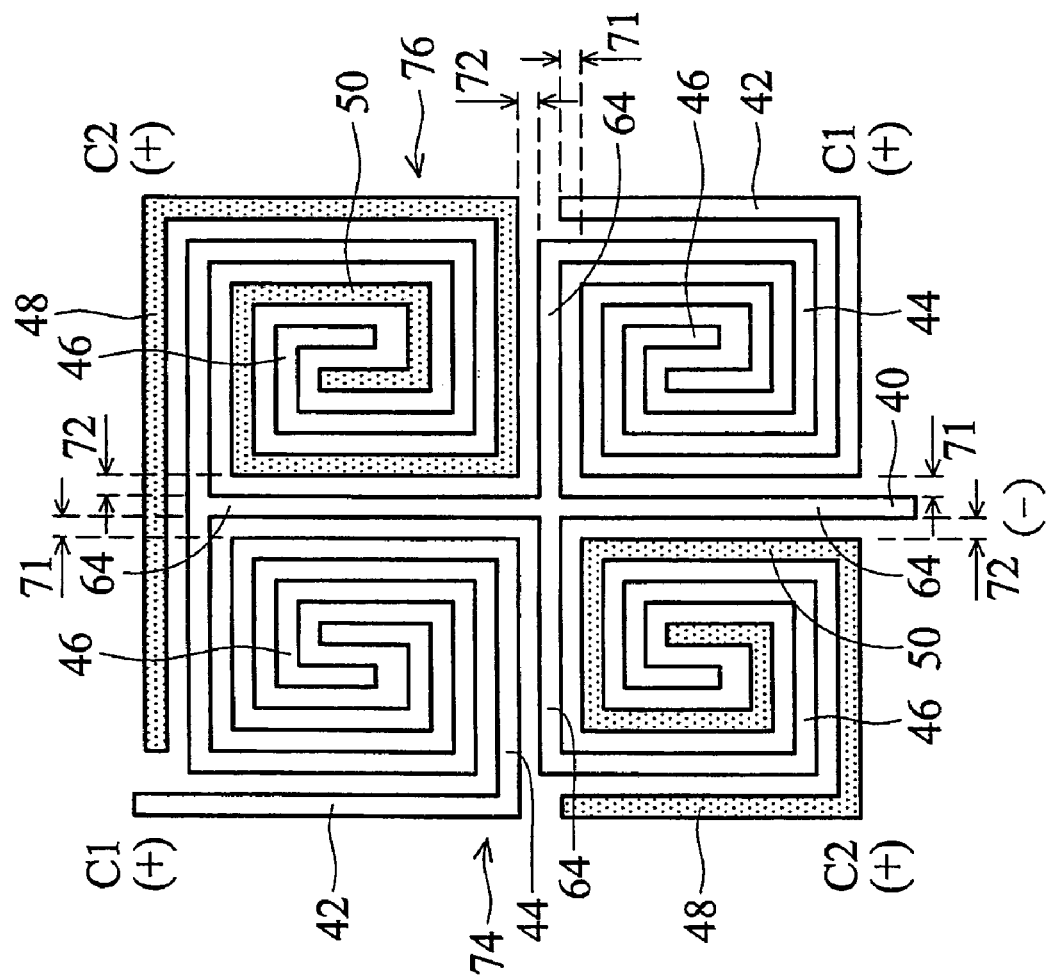
FIG. 9 shows a second illustrative embodiment of the present invention.

FIG. 9 shows a second illustrative embodiment of the present invention. FIG. 9 shows a top plan view for part of a matched capacitor pair structure 74 for a given layer 76. The overall capacitor structure 74 may extend into other layers (e.g., interconnected by conductive vias). The capacitor structure 74 of FIG. 9 may be repeated in other layers above and/or below the given layer 76 shown in FIG. 9. In such layers, the structure 74 may have the same orientation as the given layer 76 shown in FIG. 9, the structure 74 may be flipped vertically, flipped horizontally, rotated 90 degrees, or rotated 180 degrees in a plan view, or combinations thereof, for example. The capacitor structure 74 of the second embodiment has a common terminal routing configuration, for example, because the two match capacitors C1 and C2 share a common electrode 40 (e.g., a common ground electrode). The capacitor structure 74 of FIG. 9 is a cross-coupled structure. The electrode fingers 44 of capacitor C1 (top-left quadrant and bottom-right quadrant) are electrically connected and part of a same capacitor electrode 42 (e.g., a positive electrode of capacitor C1), even though their connection is not shown in FIG. 9. Likewise, the electrode fingers 50 of capacitor C2 (top-right quadrant and bottom-left quadrant) are electrically connected and part of a same capacitor electrode 48 (e.g., a positive electrode of capacitor C2), even though their connection is also not shown in FIG. 9. Hence, the second embodiment may have even better control of mismatch effects than the first embodiment of FIG. 8.

Similar to the first embodiment of FIG. 8, the second embodiment of FIG. 9 has several occurrences of the pattern of first capacitor electrode—common electrode—second capacitor electrode, with approximately equal spacing (71, 72) between them. An advantage of this structure and spacing is that less chip real estate is required for the two capacitors C0 and C2, as compared to a structure of the prior art (see e.g., FIGS. 6 and 7).

Figure 10:
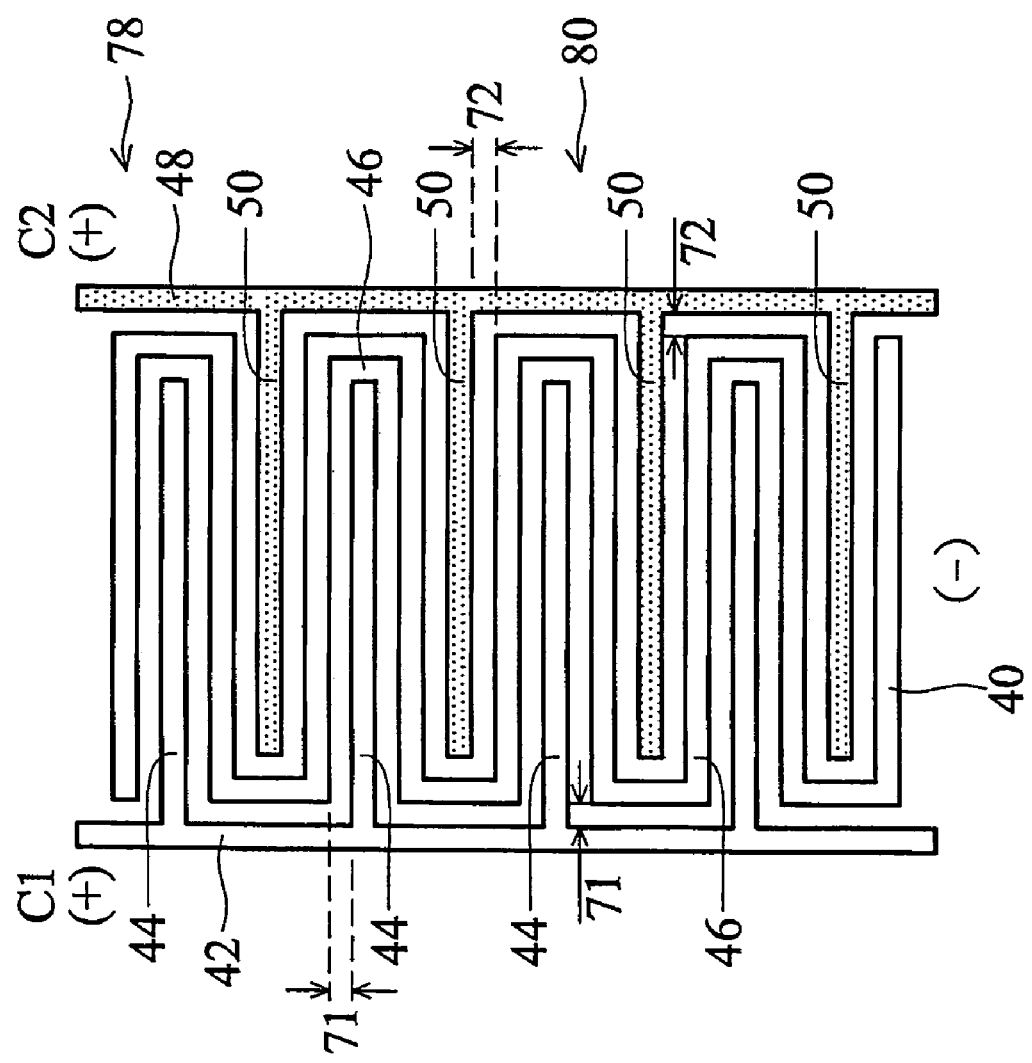
FIG. 10 shows a third illustrative embodiment of the present invention.

FIG. 10 shows a third illustrative embodiment of the present invention. FIG. 10 shows a top plan view for part of a matched capacitor pair structure 78 for a given layer 80. The overall capacitor structure may extend into other layers (e.g., interconnected by conductive vias). The capacitor structure 78 of FIG. 10 may be repeated in other layers above and/or below the given layer 80 shown in FIG. 10. In such layers, the structure 78 may have the same orientation as the given layer shown in FIG. 10, the structure 78 may be flipped vertically, flipped horizontally, rotated 90 degrees, or rotated 180 degrees in a plan view, or combinations thereof, for example. The capacitor structure 78 of the third embodiment has a common terminal routing configuration, for example, because the two match capacitors C1 and C2 share a common electrode 40 (e.g., a common ground electrode). The common electrode 40 of the third embodiment has a repeated Z shape that meanders back and forth between the first set of electrode fingers 44 for the first capacitor C1 and the second set of electrode fingers 50 for the second capacitor C2.

In the portion of the third embodiment shown in FIG. 10, each of the first set of electrode fingers 44 for capacitor C1 is adjacent to two portions of the common electrode finger 46, and each of the second set of electrode fingers 50 for capacitor C2 is adjacent to two portions of the common electrode finger 46, in the given layer 80. A first distance 71 is between the common electrode fingers 46 and the adjacent fingers of the first set of electrode fingers 44. A second distance 72 is between the common electrode fingers 46 and the adjacent fingers of the second set of electrode fingers 50, as well. In a preferred embodiment, the first distance 71 is less than being about 20% greater than the second distance 72, and the second distance 72 is less than being about 20% greater than the first distance 71. In other words, the first distance 71 is not more than about 20% lesser or greater than the second distance 72. In a more preferred embodiment, the first distance 71 is equal to or approximately equal to the second distance 72. Thus, the capacitor structure 78 of the third embodiment has a pattern of first capacitor electrode—common electrode—second capacitor electrode, with approximately equal spacing between them. An advantage of this structure and spacing is that less chip real estate is required for the two capacitors C1 and C2, as compared to a structure of the prior art (see e.g., FIGS. 6 and 7).

Another advantage of the third embodiment is that the footprint area for the first capacitor C1 overlaps with the footprint area for the second capacitor C2. More than a majority of the footprint area for capacitor C1 in the given layer 80 shown in FIG. 10, overlaps with the footprint area for capacitor C2 in the given layer 80. Not only does this conserve chip real estate, but is also helps to reduce or eliminate mismatch effects. The third embodiment is not cross-coupled, yet it provides the advantages of a cross-coupled capacitor structure because so much of the footprint area for capacitor C1 overlaps with that of capacitor C2. Although not shown, the structure of the third embodiment may be repeated and used to form a cross-coupled capacitor structure of another embodiment, for example.

Figure 11:
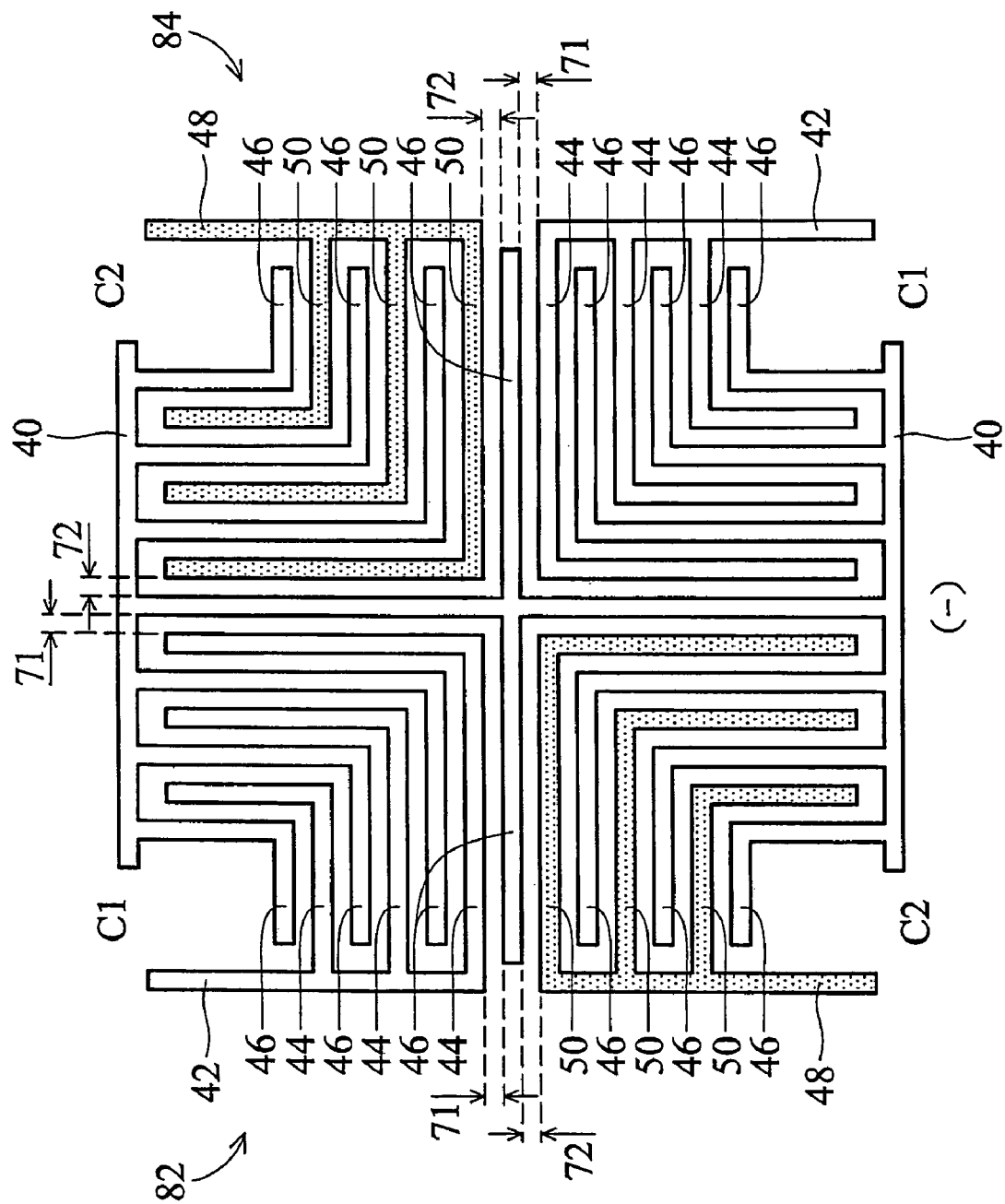
FIG. 11 shows a fourth illustrative embodiment of the present invention.

FIG. 11 shows a fourth illustrative embodiment of the present invention. FIG. 11 shows a top plan view for part of a matched capacitor pair structure 82 for a given layer 84. The overall capacitor structure may extend into other layers (e.g., interconnected by conductive vias). The capacitor structure 82 of FIG. 11 may be repeated in other layers above and/or below the given layer 84 shown in FIG. 11. In such layers, the structure 82 may have the same orientation as the given layer 84 shown in FIG. 11, the structure 82 may be flipped vertically, flipped horizontally, rotated 90 degrees, or rotated 180 degrees in a plan view, or combinations thereof, for example. The capacitor structure 82 of the fourth embodiment has a common terminal routing configuration, for example, because the two match capacitors C1 and C2 share a common electrode 40 (e.g., a common ground electrode). The common electrode 40 of the fourth embodiment has a cross shape at its center and many L-shaped fingers forming quadrants of an overall cross shape. The fourth embodiment is in some ways similar to or comparable to the second embodiment of FIG. 9 because the first capacitor C1 has electrode fingers 44 in the top-left and bottom-right quadrants, which are cross coupled, and because the second capacitor C2 has electrode fingers 50 in the top-right and bottom-left quadrants, which are also cross coupled.

In the portion of the fourth embodiment shown in FIG. 11, each of the first set of electrode fingers 44 for capacitor C1 is adjacent to two portions of the common electrode fingers 46, and each of the second set of electrode fingers 50 for capacitor C2 is adjacent to two portions of the common electrode fingers 46. A first distance 71 is between the common electrode fingers 46 and the adjacent fingers of the first set of electrode fingers 44. A second distance 72 is between the common electrode fingers 46 and the adjacent fingers of the second set of electrode fingers 50, as well. In a preferred embodiment, the first distance 71 is less than being about 20% greater than the second distance 72, and the second distance 72 is less than being about 20% greater than the first distance 71. In other words, the first distance 71 is not more than about 20% lesser or greater than the second distance 72. In a more preferred embodiment, the first distance 71 is equal to or approximately equal to the second distance 72. Thus, the capacitor structure 82 of the fourth embodiment has a pattern of first capacitor electrode—common electrode—second capacitor electrode, with approximately equal spacing between them, at the central region where the cross-shaped portion of the common electrode 40 is located. An advantage of this structure and spacing is that less chip real estate is required for the two capacitors, as compared to a structure of the prior art (see e.g., FIGS. 6 and 7).

Figure 12:
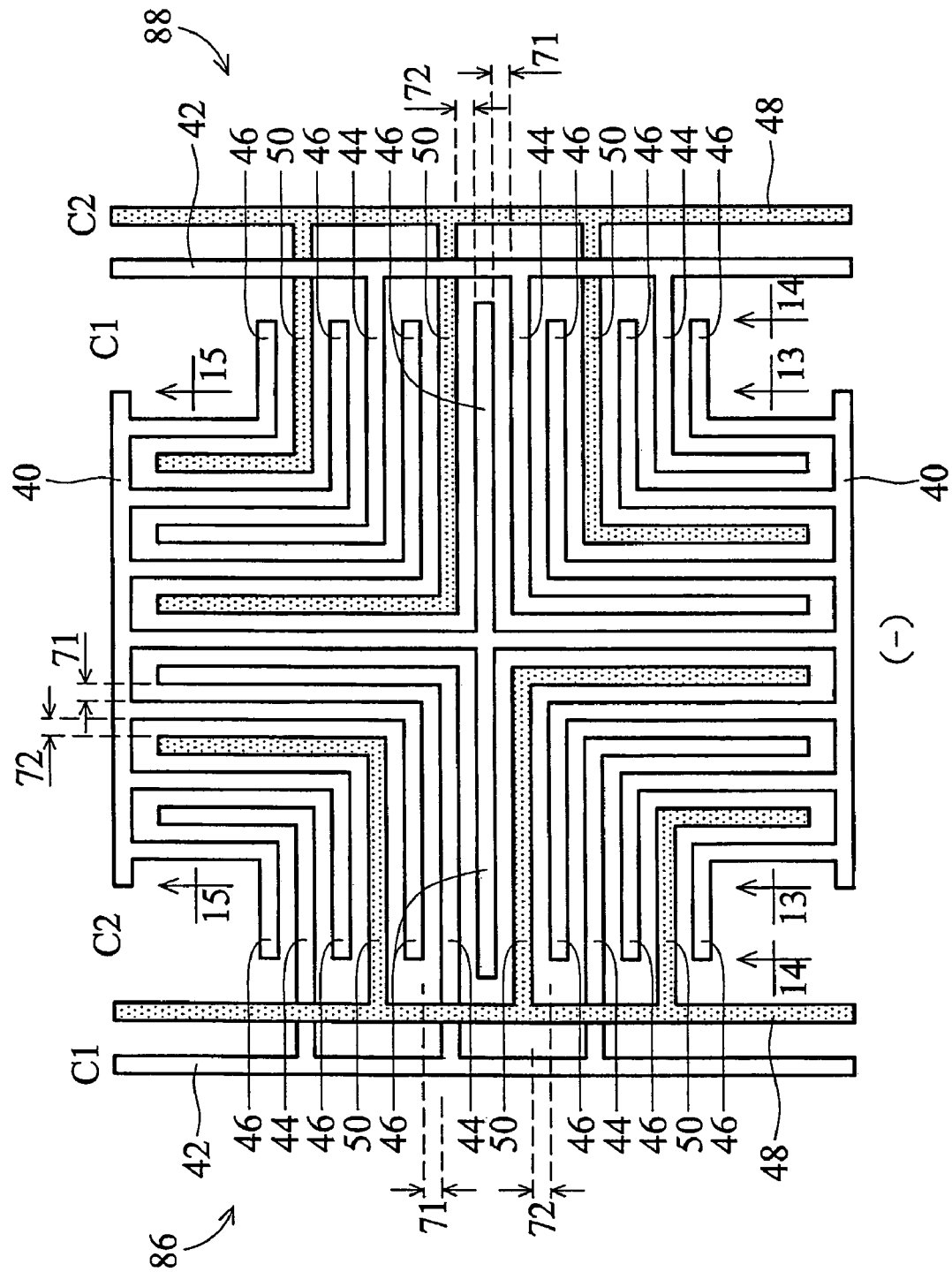
FIG. 12 shows a fifth illustrative embodiment of the present invention.

FIG. 12 shows a fifth illustrative embodiment of the present invention. The capacitor structure 86 of the fifth embodiment has a common terminal routing configuration, for example, because the two match capacitors C1 and C2 share a common electrode 40 (e.g., a common ground electrode). The fifth embodiment of FIG. 12 is a variation on the fourth embodiment of FIG. 11, in that the common electrode is the same in these embodiments. In the fifth embodiment, the first set of electrode fingers 44 of capacitor C1 are alternated with the second set of electrode fingers 50 of capacitor C2. Thus for the fifth embodiment, the mismatch reduction may be even greater than that of the fourth embodiment because more of the footprint area for capacitor C1 overlaps with the footprint area of capacitor C2. Although not shown in FIG. 12, the electrode fingers 44 on the left side for capacitor C1 are electrically connected to those of the right side to form a cross-coupled capacitor structure. The same is true for capacitor C2 in this example.

FIG. 12 shows a top plan view for part of a matched capacitor pair structure 86 for a given layer 88. The overall capacitor structure may extend into other layers (e.g., interconnected by conductive vias). The capacitor structure 86 of FIG. 12 may be repeated in other layers above and/or below the given layer 88 shown in FIG. 12. In such layers, the structure 86 may have the same orientation as the given layer 88 shown in FIG. 12, the structure 86 may be flipped vertically, flipped horizontally, rotated 90 degrees, or rotated 180 degrees in a plan view, or combinations thereof, for example. This is illustrated in FIGS. 13-14.

Figure 13:
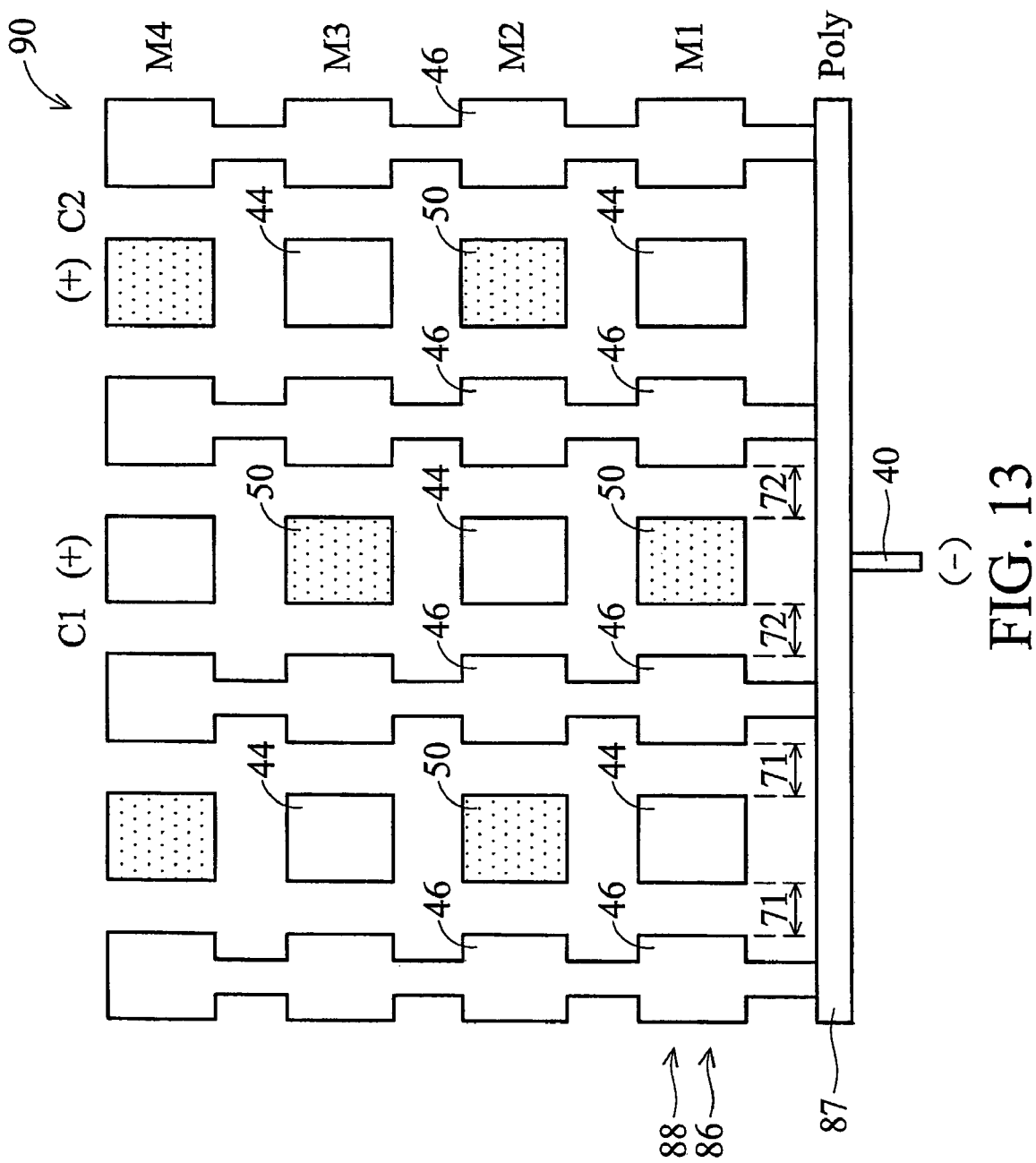
FIG. 13 is a cross-section view for a stacked or layered capacitor structure that incorporates the structure of the fifth embodiment shown in FIG. 12, as taken along line 13-13.

FIG. 13 is a cross-section view for a stacked or layered capacitor structure 90 that incorporates the structure 86 of the fifth embodiment shown in FIG. 12, as taken along line 13-13, for example. In FIG. 13, the structure 86 of FIG. 12 in the given layer has been rotated 90 degrees for the second layer so that vertically there is a pattern of capacitor C1 electrode finger—capacitor C2 electrode finger—capacitor C1 electrode finger, etc. As shown in FIG. 13, the connecting line 87 may be polysilicon. But in other embodiments, the connecting line 87 may be any suitable conductive material.

Figure 14:
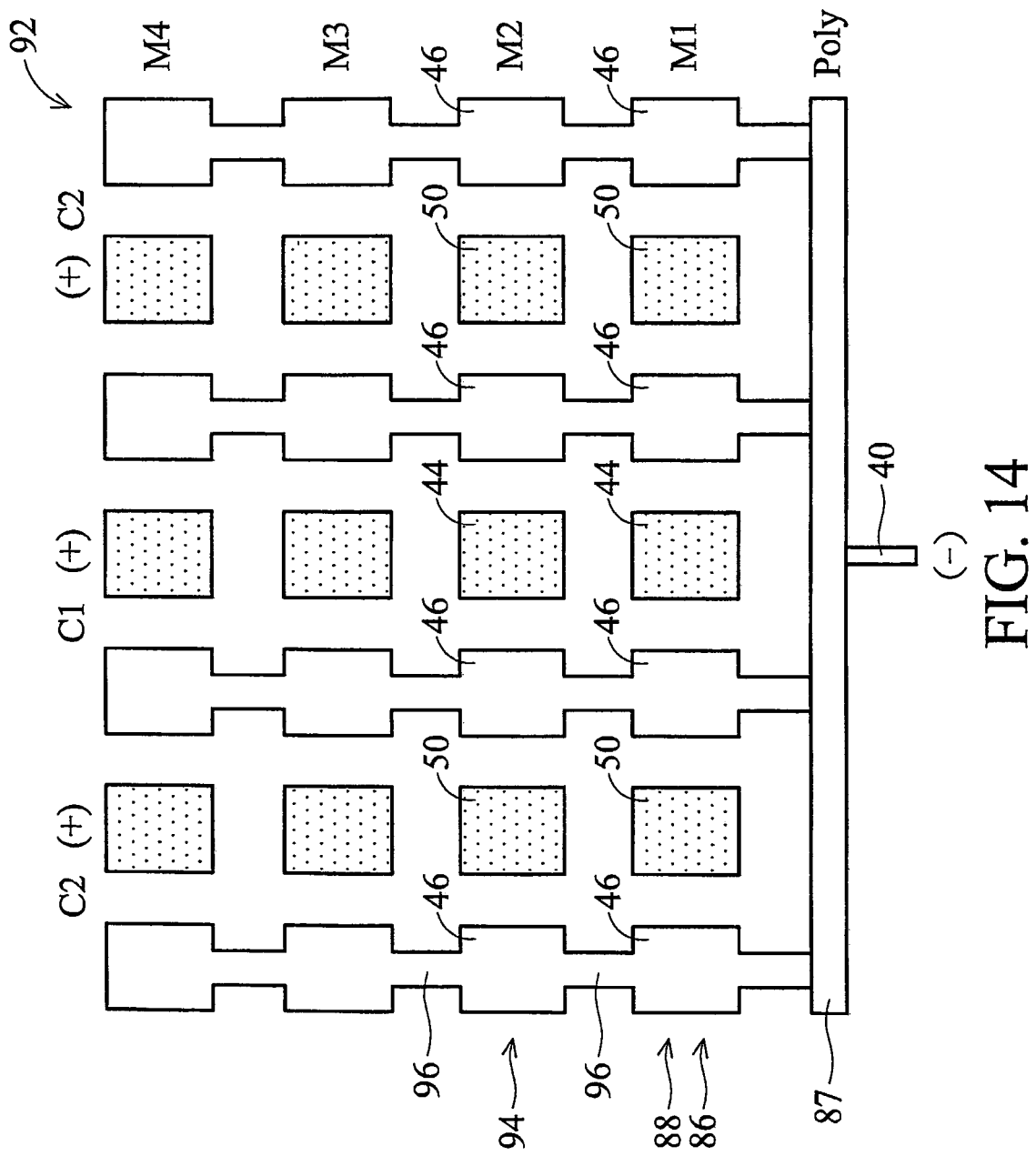
FIG. 14 is a cross-section view for another stacked or layered capacitor structure that incorporates the structure of the fifth embodiment shown in FIG. 12, as taken along line 14-14.

FIG. 14 is a cross-section view for another stacked or layered capacitor structure 92 that incorporates the structure 86 of the fifth embodiment shown in FIG. 12, as taken along line 14-14, for example. In FIG. 14, the structure 86 of FIG. 12 in the given layer 88 is repeated for the second layer 94 so that vertically there are patterns of capacitor C1 electrode finger—capacitor C1 electrode finger—capacitor C1 electrode finger, etc., and capacitor C2 electrode finger—capacitor C2 electrode finger—capacitor C2 electrode finger, etc. Note that in FIGS. 13 and 14 the common electrode fingers 46 may be electrically connected among adjacent layers using conductive vias 96. Likewise in the configuration of FIG. 14, the same capacitor electrode fingers over each other may be electrically connected by conductive vias (not shown). As shown in FIG. 14, the connecting line 87 may be polysilicon. But in other embodiments, the connecting line 87 may be any suitable conductive material.

Figure 15:
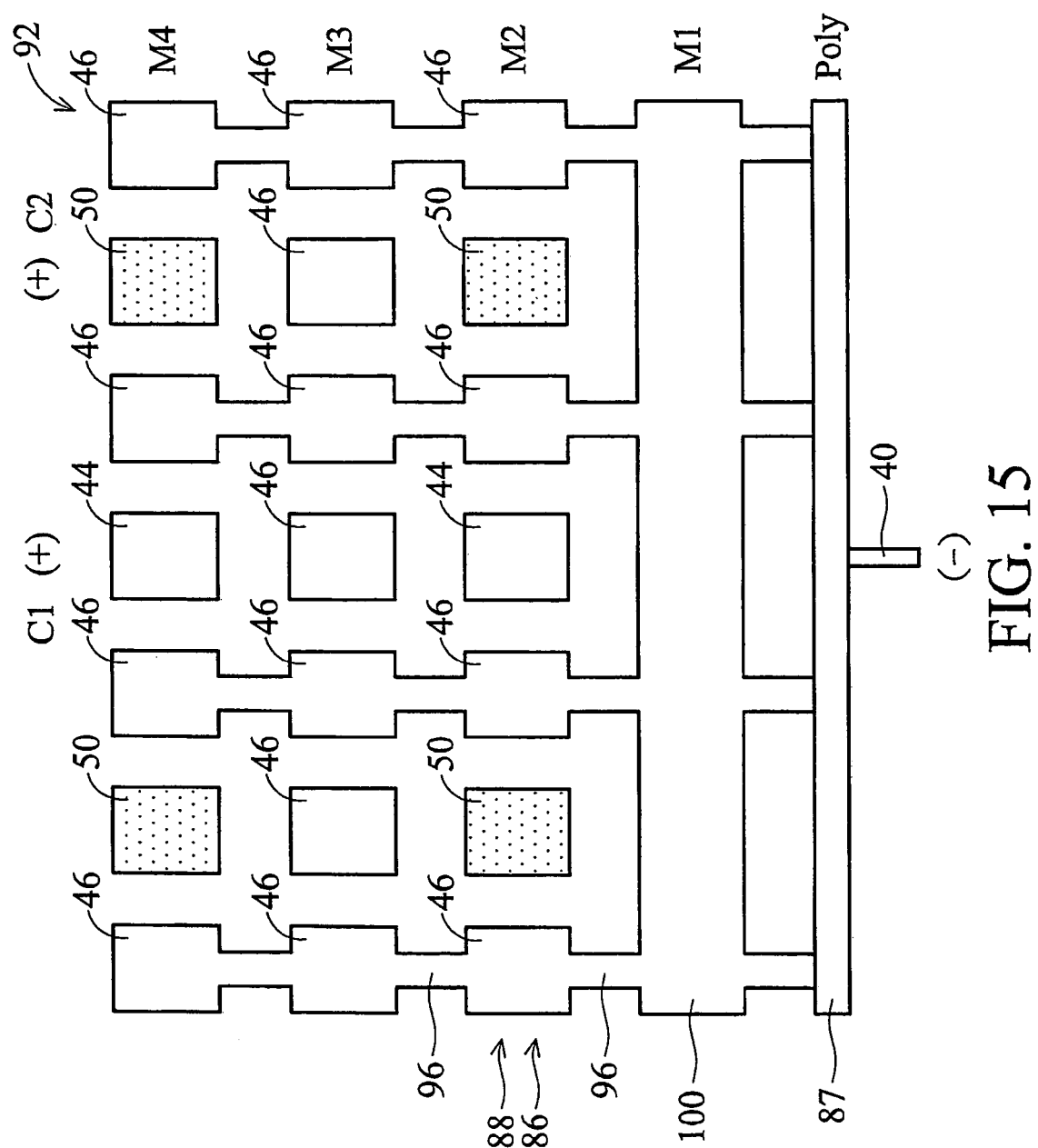
FIG. 15 is a cross-section view for a stacked or layered capacitor structure that incorporates the structure of the fifth embodiment shown in FIG. 12, as taken along line 15-15.

FIG. 15 is a cross-section view for a stacked or layered capacitor structure 98 that incorporates the structure 86 of the fifth embodiment shown in FIG. 12, as taken along line 15-15, for example. In FIG. 15, the structure 86 of FIG. 12 in the given layer is alternated with a layer of common electrode fingers 46 so that vertically there is a pattern of capacitor C1 electrode finger—common electrode finger (or plate)—capacitor C1 electrode finger, etc. Note that in FIG. 15, a bottom plate shield 100 is used. In other embodiments, a bottom plate shield and/or a top plate shield may be incorporated. Hence, other semiconductor devices may be located under and/or over a device of an embodiment.

Figure 16:
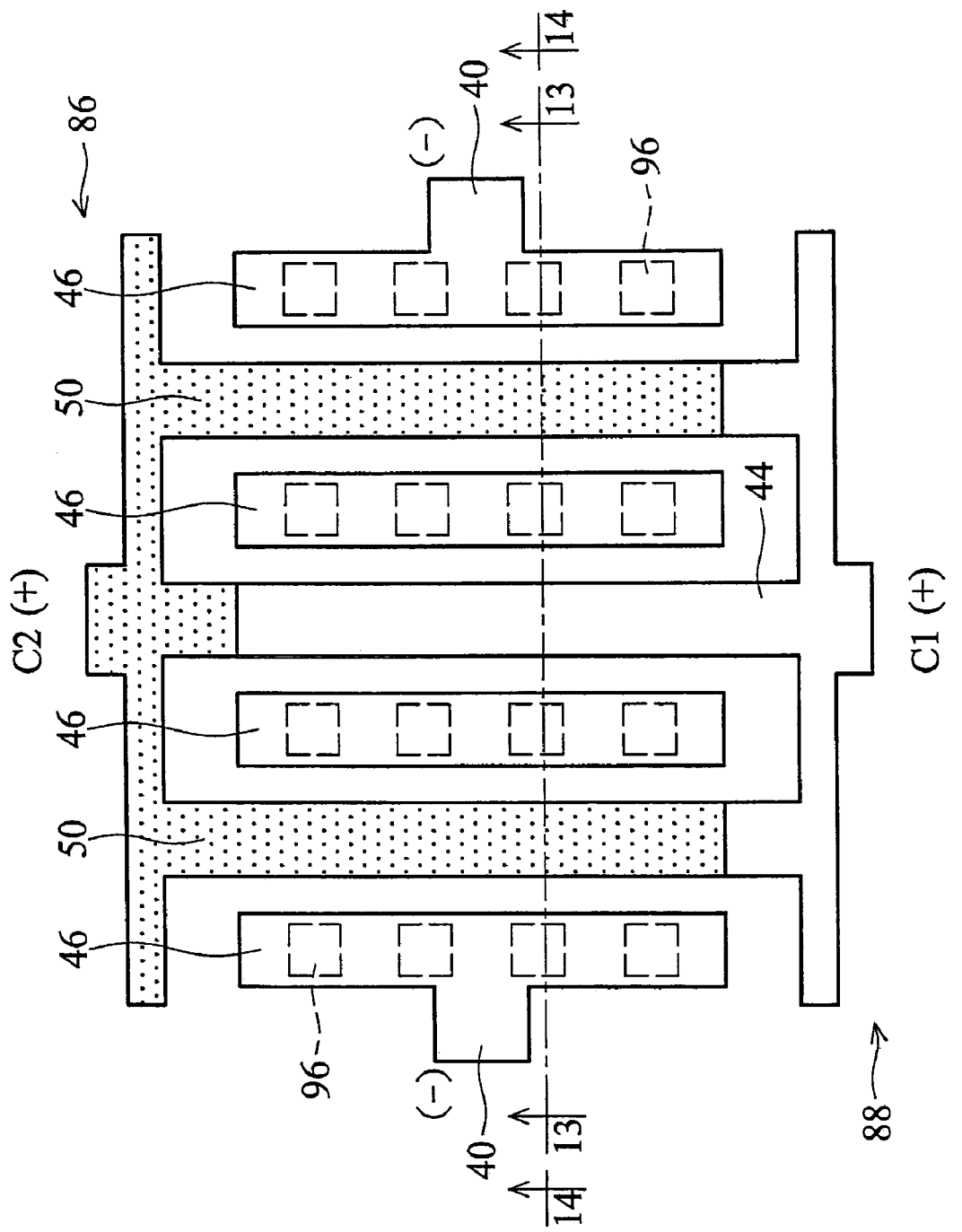
FIG. 16 shows a sixth illustrative embodiment of the present invention.

FIG. 16 shows a sixth illustrative embodiment of the present invention. The capacitor structure 86 of the sixth embodiment has a common terminal routing configuration, for example, because the two match capacitors C1 and C2 share a common electrode 40 (e.g., a common ground electrode). In the sixth embodiment, the first set of electrode fingers 44 of capacitor C1 are alternated with the second set of electrode fingers 50 of capacitor C2. FIG. 16 shows a top plan view for part of a matched capacitor pair structure 86 for a given layer 88. The overall capacitor structure may extend into other layers (e.g., interconnected by conductive vias 96). The capacitor structure 86 of FIG. 16 may be repeated in other layers above and/or below the given layer 88 shown in FIG. 16. In such layers, the structure 86 may have the same orientation as the given layer 88 shown in FIG. 16, the structure 86 may be flipped vertically in a plan view, for example. This is illustrated in FIGS. 13-14. FIGS. 13 and 14 may also be cross-section views for the structure 86 of the sixth embodiment shown in FIG. 16, as taken along lines 13-13 and 14-14 in FIG. 16.

Figure 17:
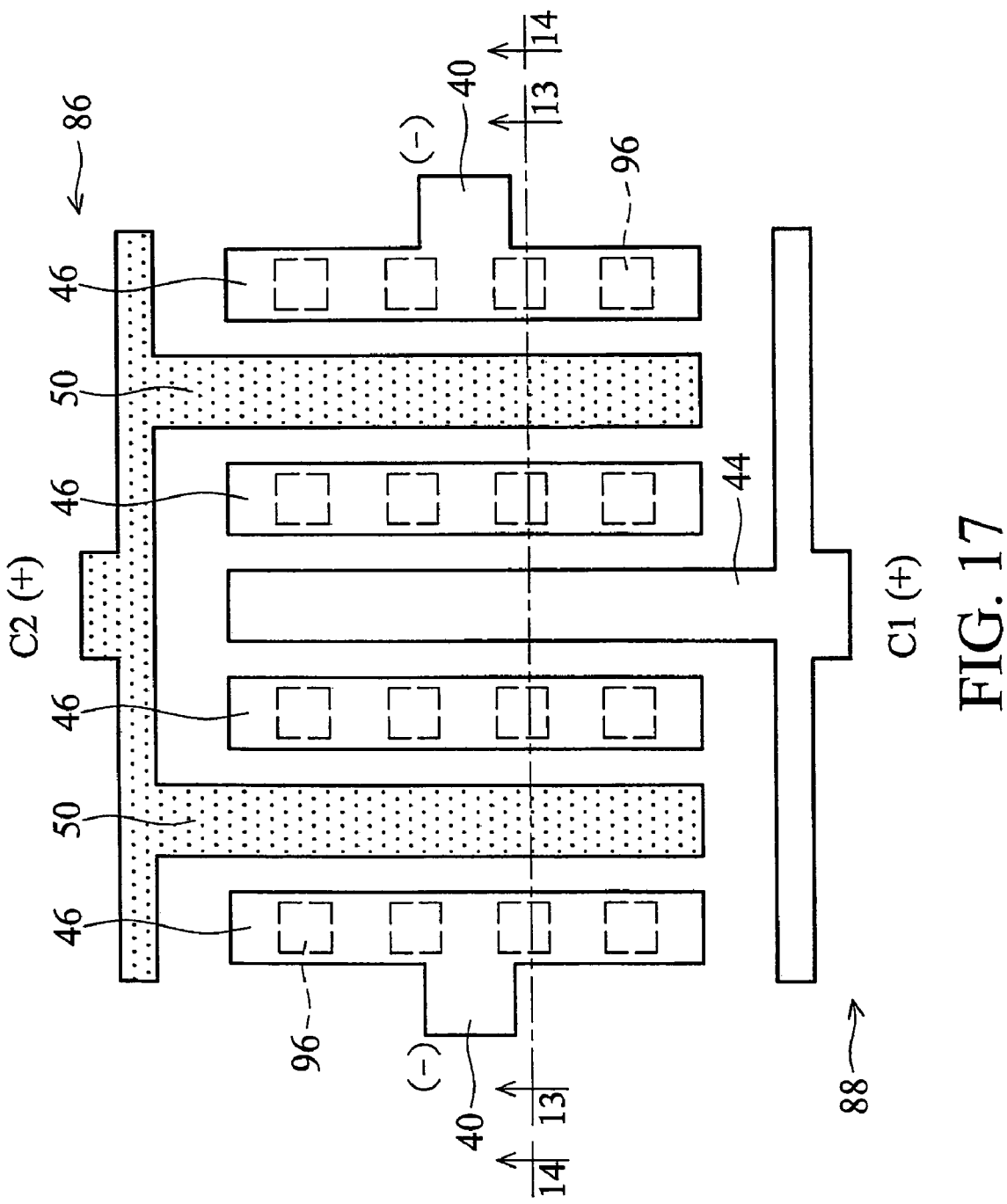
FIG. 17 shows a seventh illustrative embodiment of the present invention.

FIG. 17 shows a seventh illustrative embodiment of the present invention. The capacitor structure 86 of the seventh embodiment has a common terminal routing configuration, for example, because the two match capacitors C1 and C2 share a common electrode 40 (e.g., a common ground electrode). In the seventh embodiment, the first set of electrode fingers 44 of capacitor C1 are alternated with the second set of electrode fingers 50 of capacitor C2. FIG. 17 shows a top plan view for part of a matched capacitor pair structure 86 for a given layer 88. The overall capacitor structure may extend into other layers (e.g., interconnected by conductive vias 96). The capacitor structure 86 of FIG. 17 may be repeated in other layers above and/or below the given layer 88 shown in FIG. 17. In such layers, the structure 86 may have the same orientation as the given layer 88 shown in FIG. 17, the structure 86 may be flipped vertically in a plan view, for example. This is illustrated in FIGS. 13-14. FIGS. 13 and 14 may also be cross-section views for the structure 86 of the seventh embodiment shown in FIG. 17, as taken along lines 13-13 and 14-14 in FIG. 17.

Figure 18:
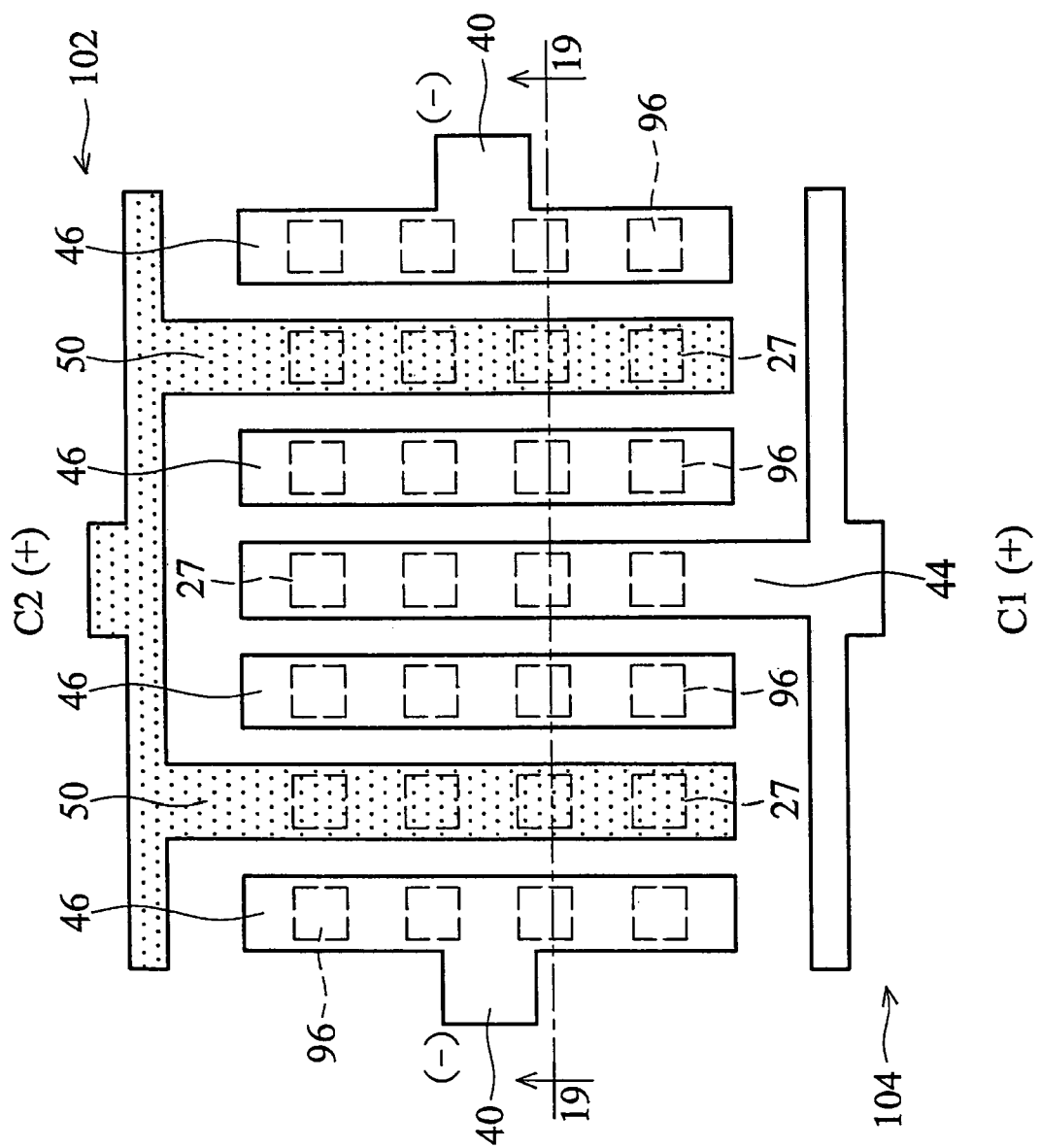
FIG. 18 shows an eighth illustrative embodiment of the present invention.
Figure 19:
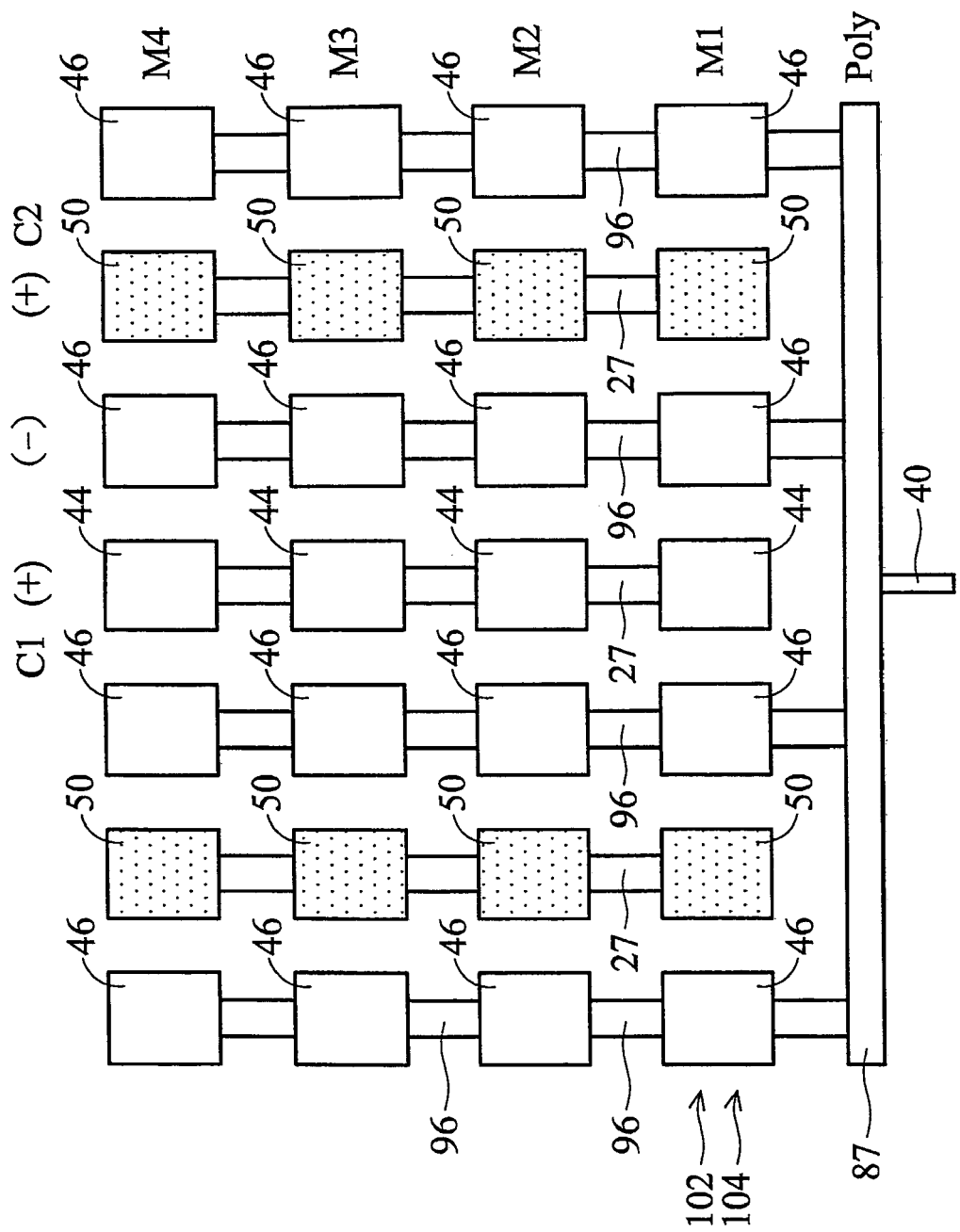
FIG. 19 is a cross-section view for a stacked or layered capacitor structure that incorporates the structure of the eighth embodiment shown in FIG. 18, as taken along line 19-19.

FIG. 18 shows an eighth illustrative embodiment of the present invention. The capacitor structure 102 of the sixth embodiment has a common terminal routing configuration, for example, because the two match capacitors C1 and C2 share a common electrode 40 (e.g., a common ground electrode). The eighth embodiment is essentially the same as that of the seventh embodiment shown in FIG. 17, except that conductive vias 27 connect between the like capacitor fingers (between fingers 44 and between fingers 50). In the eighth embodiment, the first set of electrode fingers 44 of capacitor C1 are alternated with the second set of electrode fingers 50 of capacitor C2. FIG. 18 shows a top plan view for part of a matched capacitor pair structure 102 for a given layer 104. The overall capacitor structure may extend into other layers (e.g., interconnected by conductive vias 27 and 96). The capacitor structure 102 of FIG. 18 may be repeated in other layers above and/or below the given layer 104 shown in FIG. 18. In such layers, the structure 102 may have the same orientation as the given layer 104 shown in FIG. 18, the structure 102 may be flipped vertically in a plan view, for example. FIG. 19 is a cross-section view of the eighth embodiment as taken along line 19-19 in FIG. 18.

An embodiment of the present invention may be advantageous for larger capacitors with a capacitance value of more than about 1 pF, for example. Although a few illustrative embodiment shapes have been shown in FIGS. 8-19 (discussed above), there may be other overall shapes and/or shapes for the common electrode for other embodiments (not shown). A common electrode feature or finger may have any suitable shape, including (but not limited to): a cross shape, an X shape, a T shape, a straight line shape, a curved shape, a spiral shape, an S shape, a Z shape, a repeated S shape, a repeated Z shape, and combinations thereof, for example.

While the preferred embodiments discussed above are MOM capacitors, the teachings of this disclosure may also apply to MIM capacitors, inductors, resistors, transistors, varactors, and other semiconductor devices, for example. Any two elements of a semiconductor device may be combined into a single footprint area or may have footprint areas in a given layer that mostly overlap, for example, to form other embodiments of the present invention. An embodiment of the present invention may include one or more of the following devices (but not necessarily limited to these listed) in any suitable combination: a capacitor, an inductor, a resistor, a transistor, a MIM capacitor, a MOM capacitor, or a varactor.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising:
    a first capacitor comprising a first feature, the first capacitor having a first area in a given layer of a metallization level, the first feature being disposed at least partially in the given layer, the first feature having a plurality of fingers each having a first portion extending longitudinally in a first direction, each of the fingers having a second portion co-planar in a plan view perspective with the first portion extending from the first portion in a second direction that is non co-linear with the first direction;
    a second capacitor comprising a second feature, the second capacitor having a second area in the given layer of the metallization level, the second being disposed at least partially in the given layer, and the first and second capacitors being electrically matched, the first capacitor and the second capacitor being symmetrical about a central axis from the plan view perspective; and a common electrode feature that is common to the first and second capacitors, the common electrode feature being at least partially located in the given layer, the common electrode feature having a plurality of common electrode fingers each comprising a first portion extending longitudinally in a third direction and a second portion co-planar in the plan view perspective with the first portion extending from the first portion longitudinally in a fourth direction that is non co-linear with the third direction;

wherein a first spacing between the first feature and the common electrode feature is about the same as a second spacing between the second feature and the common electrode feature.

2. The integrated circuit chip of claim 1, wherein the common electrode feature is part of a ground electrode shared by the first and second capacitors, wherein the first feature is an inner-most finger of a positive electrode for the first capacitor, and wherein the second feature is an inner-most finger of a positive electrode for the second capacitor.

3. The integrated circuit chip of claim 1, wherein the first and second capacitors are interdigitated capacitors.

4. The integrated circuit chip of claim 1, wherein the common electrode feature has a shape selected from the group consisting of a cross shape, an X shape, a T shape, a straight line shape, a curved shape, a spiral shape, an S shape, a Z shape, a repeated S shape, a repeated Z shape, and combinations thereof.

5. An integrated circuit chip comprising:
a first electronic device comprising a first conductive line with a first conductive feature extending away therefrom disposed in a given insulating layer, the given insulating layer being defined as extending from a top surface of the first conductive feature to a bottom surface of the first conductive feature, the first conductive line and the first conductive feature being non co-linear, and having a second conductive portion co-planar, in a plan view perspective, with and extending longitudinally from the first conductive feature in a first direction that is non co-linear with the first conductive feature;

a second electronic device comprising a second conductive line with a second conductive feature extending away therefrom in the given insulating layer, the first and second electronic devices being electrically matched, the second conductive line and the second conductive feature being non co-linear; and a common electrode feature that is common to the first and second electronic devices, the common electrode feature being at least partially located in the given insulating layer, the common electrode feature having a plurality of common electrode fingers each comprising a first portion extending longitudinally in a second direction and a second portion co-planar, in the plan view perspective, with the first portion and extending from the first portion longitudinally in a third direction that is non co-linear with the second direction;

wherein a first spacing is between the first conductive feature and the common electrode feature, and a second spacing is between the second conductive feature and the common electrode feature, and wherein the first electronic device is a mirror image of the second electronic device from the plan view perspective about a central axis when the first spacing is equal to the second spacing.

6. The integrated circuit chip of claim 5, wherein the first and second electronic devices are capacitors.

7. The integrated circuit chip of claim 6, wherein the common electrode feature is part of a ground electrode shared by the first and second electronic devices, wherein the first conductive feature is an inner-most finger of a positive electrode for the first electronic device, and wherein the second conductive feature is an inner-most finger of a positive electrode for the second electronic device.

8. The integrated circuit chip of claim 6, wherein the first and second electronic devices are interdigitated capacitors.

9. The integrated circuit chip of claim 5,
wherein the first electronic device has a first area in the given insulating layer,
wherein the second electronic device has a second area in the given insulating layer, and
wherein more than a majority of the first area is coextensive with the second area in the given insulation layer.

10. The integrated circuit chip of claim 5, wherein the common electrode feature has a shape selected from the group consisting of a cross shape, an X shape, a T shape, a straight line shape, a curved shape, a spiral shape, an S shape, a Z shape, a repeated S shape, a repeated Z shape, and combinations thereof.

11. An integrated circuit chip comprising:
a first interdigitated capacitor device comprising a first set of electrode fingers extending away from a first conductive line in a given insulating layer, the first set of fingers each having a first portion extending longitudinally in a first direction, each of the first set of fingers having a second portion co-planar, in a plan view perspective, with the first portion and extending from the first portion in a second direction that is non co-linear with the first direction;

a second interdigitated capacitor device comprising a second set of electrode fingers extending away from a second conductive line in the given insulating layer; and a common electrode shared by the first and second interdigitated capacitor devices, the common electrode comprising a set of common electrode fingers in the given insulating layer, the common electrode fingers each comprising a first portion extending longitudinally in a third direction and a second portion co-planar, in the plan view perspective, with the first portion and extending from the first portion longitudinally in a fourth direction that is non co-linear with the third direction;

wherein at least one of the first set of electrode fingers is adjacent to a certain one of the common electrode fingers and separated by a first distance, wherein at least one of the second set of electrode fingers is adjacent to the certain one of the common electrode fingers and separated by a second distance, and wherein from the plan view the first interdigitated capacitor device is a mirror image of the second interdigitated capacitor device about a central axis when the first distance is equal to the second distance.

12. The integrated circuit chip of claim 11, wherein each of the first set of electrode fingers is adjacent to at least one of the common electrode fingers.

13. The integrated circuit chip of claim 11, wherein each of the second set of electrode fingers is adjacent to at least one of the common electrode fingers.

14. The integrated circuit chip of claim 11,
wherein a top view of the first interdigitated capacitor device has a first area in the given insulating layer,
wherein a top view of the second interdigitated capacitor device has a second area in the given insulating layer, and
wherein in a top view of the first and second interdigitated capacitor devices, more than a majority of the first area in the given insulating layer is coextensive with second area in the given insulating layer.

15. The integrated circuit chip of claim 11, wherein at least a portion of the set of common electrode fingers, has a shape selected from the group consisting of a cross shape, an X shape, a T shape, a straight line shape, a curved shape, a spiral shape, an S shape, a Z shape, a repeated S shape, a repeated Z shape, and combinations thereof, wherein such portion comprises the certain one of the common electrode fingers.

16. The integrated circuit chip of claim 1, wherein the first capacitor is a mirror image of the second capacitor when the first spacing is equal to the second spacing.

17. The integrated circuit chip of claim 1, wherein a portion of the common electrode feature forming the first capacitor and a portion of the common electrode feature forming the second capacitor are mirror images of each other when the first spacing is equal to the second spacing.

18. The integrated circuit chip of claim 5, wherein a plane of symmetry between the first and the second electronic devices is co-planar with a portion of the common electrode feature.

* * * * *